(12) United States Patent
Nishio et al.

(10) Patent No.: US 12,080,813 B2
(45) Date of Patent: Sep. 3, 2024

(54) OPTICAL SEMICONDUCTOR DEVICE

(71) Applicant: HAMAMATSU PHOTONICS K.K., Hamamatsu (JP)

(72) Inventors: Fumitaka Nishio, Hamamatsu (JP); Masatsugu Takatsuka, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 142 days.

(21) Appl. No.: 17/665,885

(22) Filed: Feb. 7, 2022

(65) Prior Publication Data

US 2022/0262961 A1 Aug. 18, 2022

(30) Foreign Application Priority Data

Feb. 18, 2021 (JP) ................................ 2021-024461

(51) Int. Cl.
*H01L 31/024* (2014.01)
*H01L 25/16* (2023.01)
*H01L 31/0203* (2014.01)
*H01L 31/107* (2006.01)

(52) U.S. Cl.
CPC .......... *H01L 31/024* (2013.01); *H01L 25/165* (2013.01); *H01L 25/167* (2013.01); *H01L 31/0203* (2013.01); *H01L 31/107* (2013.01)

(58) Field of Classification Search
None
See application file for complete search history.

(56) References Cited

U.S. PATENT DOCUMENTS

| | | | |
|---|---|---|---|
| 9,793,427 B1 * | 10/2017 | Gani | G01V 8/10 |
| 2012/0218757 A1 * | 8/2012 | Gill | F21V 15/015 |
| | | | 362/249.02 |
| 2019/0131195 A1 * | 5/2019 | Fang | H01L 21/4803 |

FOREIGN PATENT DOCUMENTS

JP   H11-126835 A   5/1999

* cited by examiner

*Primary Examiner* — Sarah K Salerno
(74) *Attorney, Agent, or Firm* — Faegre Drinker Biddle & Reath LLP

(57) ABSTRACT

An optical semiconductor device includes a wiring board including a first surface and a second surface, a cover disposed to face the first surface, an optical semiconductor element disposed on the first surface, a plurality of electrodes disposed on the second surface, and a resist layer disposed on the second surface and located at least between the plurality of electrodes. A ventilation hole that penetrates the first surface and the second surface is formed in the wiring board. The second surface includes a disposition region in which the resist layer is disposed and a non-disposition region in which the resist layer is not disposed. The non-disposition region includes a first region in which the ventilation hole is disposed and a second region that reaches an edge of the second surface from the first region.

14 Claims, 6 Drawing Sheets

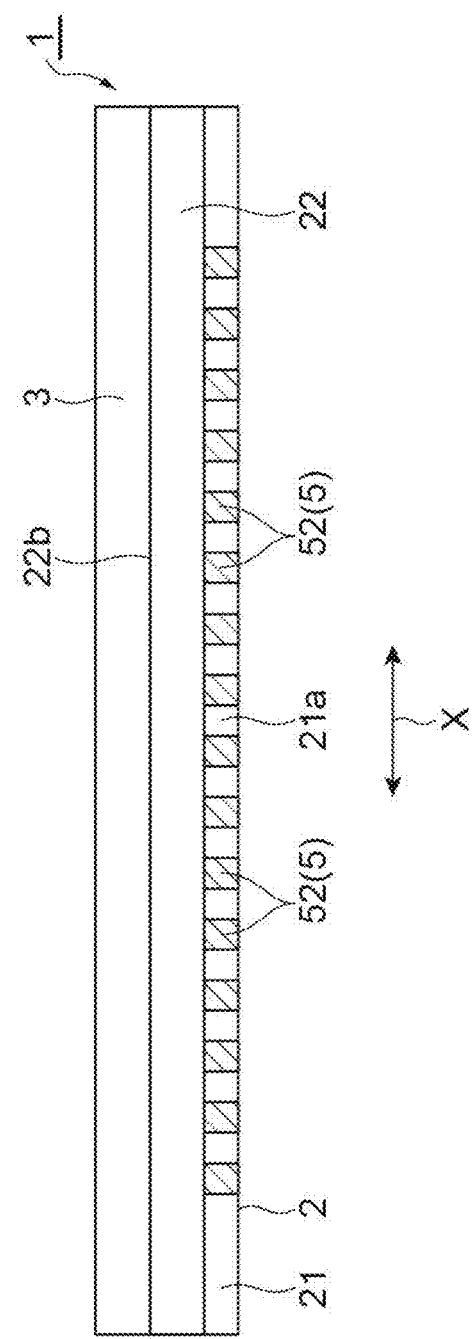
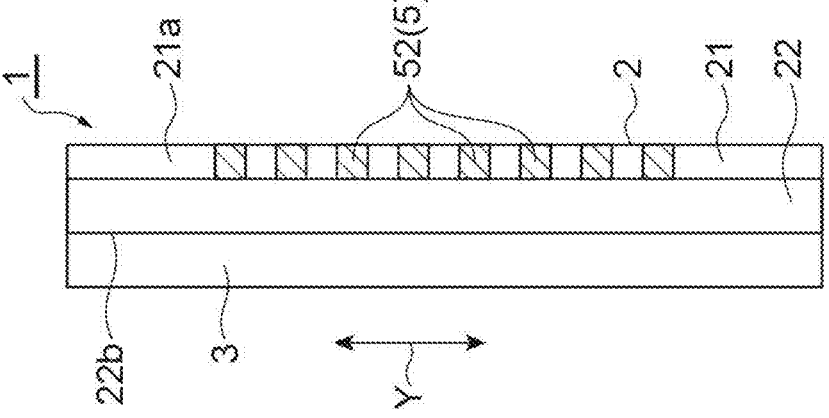

OPTICAL SEMICONDUCTOR DEVICE

TECHNICAL FIELD

An aspect of the present disclosure relates to an optical semiconductor device.

BACKGROUND

A semiconductor device described in Japanese Unexamined Patent Publication No. H11-126835 includes an insulating substrate, a semiconductor element and a reinforcing ring disposed on the insulating substrate, and a cap disposed on the semiconductor element and the reinforcing ring. A ventilation hole is formed in a side surface of the semiconductor device. In this semiconductor device, the formation of the ventilation hole suppresses an increase in pressure inside the semiconductor device.

SUMMARY

In the semiconductor device described in Japanese Unexamined Patent Publication No. H11-126835, the ventilation hole is formed in the side surface of the semiconductor device. This is because if the ventilation hole is formed in the insulating substrate, a flux may enter the ventilation hole when the semiconductor device is mounted on a printed circuit board with solder, and the air permeability may decrease. On the other hand, in a case where the ventilation hole is formed in the side surface of the semiconductor device, foreign matter may enter through the ventilation hole, for example, at the time of cutting the insulating substrate or the like. From the viewpoint of ensuring reliability, it is preferable to prevent foreign matter from entering.

An object of an aspect of the present disclosure to provide an optical semiconductor device capable of ensuring reliability and preventing a flux from entering a ventilation hole.

An optical semiconductor device according to an aspect of the present disclosure includes: a wiring board including a first surface and a second surface on a side opposite to the first surface; a cover disposed to face the first surface and defining an accommodation space between the first surface and the cover; an optical semiconductor element disposed on the first surface and located in the accommodation space; a plurality of electrodes disposed on the second surface; and a resist layer disposed on the second surface and located at least between the plurality of electrodes, wherein a ventilation hole that penetrates the first surface and the second surface is formed in the wiring board, wherein the second surface includes a disposition region in which the resist layer is disposed and a non-disposition region in which the resist layer is not disposed, and wherein the non-disposition region includes a first region in which the ventilation hole is disposed and a second region that reaches an edge of the second surface from the first region.

In the optical semiconductor device, the ventilation hole is formed in the wiring board. Thus, it is possible to prevent foreign matter from entering through the ventilation hole, for example, at the time of cutting the wiring board or the like, and it is possible to ensure reliability. Further, the second surface of the wiring board includes the disposition region in which the resist layer is disposed and the non-disposition region in which the resist layer is not disposed, and the non-disposition region includes the first region in which the ventilation hole is disposed and the second region that reaches the edge of the second surface from the first region. Since the flux is less likely to flow into the non-disposition region, by disposing the ventilation hole in the first region, it is possible to prevent the flux from entering the ventilation hole. Further, since the second region that reaches the edge of the second surface from the first region is provided, air easily flows into the second region from the outside, and as a result, the flowing air can prevent the flux from entering the ventilation hole. Further, the second region that reaches the edge of the second surface from the first region is provided, and the accommodation space is connected to the outside via the ventilation hole and the non-disposition region, and thus it is possible to improve reliability against expansion and contraction due to heat and dew condensation. Therefore, according to this optical semiconductor device, it is possible to ensure reliability and prevent the flux from entering the ventilation hole.

The second surface may include a plurality of edges, and the second region may reach an edge other than an edge closest to the ventilation hole among the plurality of edges. In this case, it is possible to effectively prevent the flux from entering the ventilation hole.

The plurality of electrodes may include an electrode disposed side by side along the edge closest to the ventilation hole. According to this optical semiconductor device, even in such a case, it is possible to prevent the flux from entering the ventilation hole.

The second surface may have a plurality of edges, and the second region may reach an edge farthest from the ventilation hole among the plurality of edges. In this case, it is possible to effectively prevent the flux from entering the ventilation hole.

An electrode pad disposed on the first surface and electrically connected to the optical semiconductor device may be further provided, and the electrode pad may be disposed at a position where the electrode pad does not overlap the non-disposition region in a thickness direction of the wiring board. In this case, the resist layer is disposed at a position corresponding to the electrode pad on the second surface, and thus a wire, a bump, or the like can be satisfactorily connected to the electrode pad.

An area of the non-disposition region may be 40% or less of an area of the second surface. In this case, it is possible to ensure the area of the disposition region as a region into which the flux flows, and it is possible to effectively prevent the flux from entering the ventilation hole.

The second region may include a portion having a width narrower than a width of the first region. In this case, the area of the disposition region can be ensured in the position far from the ventilation hole while the width of the non-disposition region can be ensured in the first region close to the ventilation hole, and it is possible to effectively prevent the flux from entering the ventilation hole.

An area of a region where the plurality of electrodes are disposed in the second surface may be 15% or more of an area of the second surface. In a case where the area of the region where the plurality of electrodes are disposed in the second surface is large, a situation where the flux enters the ventilation hole easily occurs, but according to the optical semiconductor device, even in such a case, it is possible to prevent the flux from entering the ventilation hole.

The first region may be formed in a polygonal shape having a plurality of corners. In this case, it possible to effectively prevent the flux from entering the ventilation hole as compared with a case where the first region is formed in a circular shape, for example.

The plurality of corners may include a corner protruding toward an electrode disposed at a position closest to the ventilation hole among the plurality of electrodes. In this case, the flux that has reached the corner from a side of the electrode easily flows to both sides of the corner, and thus it is possible to effectively prevent the flux from entering the ventilation hole.

The second region may include an extending portion that extends from the first region and a widened portion having a width wider than a width of the extending portion. In this case, even in a case where the flux enters the second region from a side of the widened portion, it is possible to suppress a situation where the second region is blocked with the flux.

The widened portion may be disposed at a position symmetrical to the first region with respect to a straight line passing through a center of the second surface. In this case, it is possible to make the flow of the flux symmetrical at the time of mounting, and it is possible to suppress the occurrence of positional deviation at the time of mounting.

The widened portion may have a shape symmetrical to that of the first region with respect to a straight line passing through a center of the second surface. In this case, it is possible to further suppress the occurrence of positional deviation at the time of mounting.

A distance between the ventilation hole and an electrode disposed at a position closest to the ventilation hole among the plurality of electrodes may be shorter than a distance between the ventilation hole and a center of the second surface. In a case where the distance between the ventilation hole and the electrode disposed at a position closest to the ventilation hole is short, a situation where the flux enters the ventilation hole easily occurs, but according to the optical semiconductor device, even in such a case, it is possible to prevent the flux from entering the ventilation hole.

According to the aspect of the present disclosure, it is possible to provide an optical semiconductor device capable of ensuring reliability and preventing a flux from entering a ventilation hole.

BRIEF DESCRIPTION OF THE DRAWINGS

FIG. 2A is a side view of the optical semiconductor device in an X direction, and FIG. 2B is a side view of the optical semiconductor device in a Y direction.

DETAILED DESCRIPTION

Figure 1:
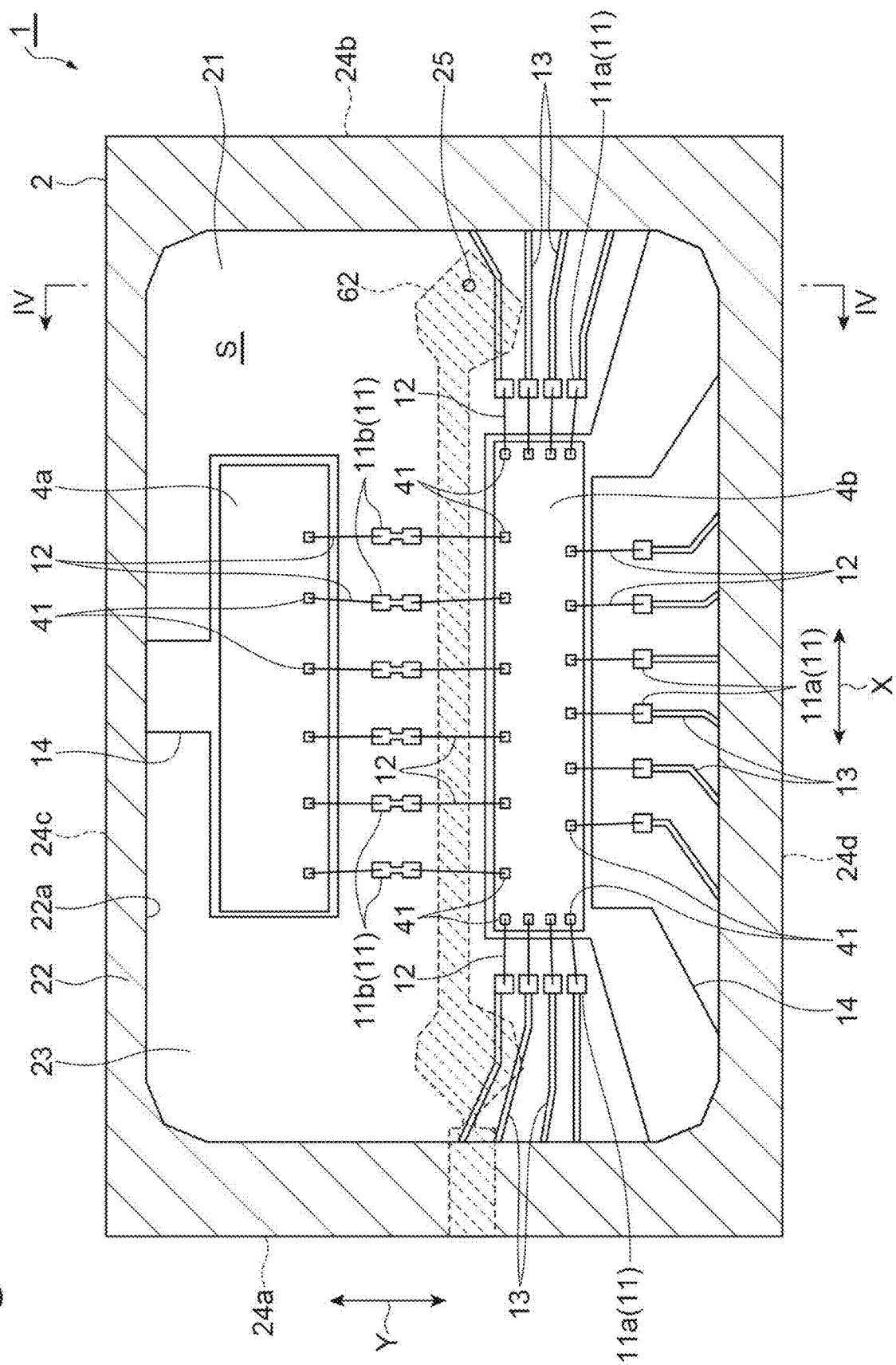
FIG. 1 is a cross-sectional view of an optical semiconductor device according to an embodiment.

Hereinafter, an embodiment of the present disclosure will be described in detail with reference to the drawings. In the following description, the same reference signs will be used for the same or equivalent elements, and duplicate description will be omitted.

As shown in FIGS. 1 to 4, an optical semiconductor device 1 includes a wiring board 2, a cover 3, an optical semiconductor element 4a, a reading element 4b, a plurality of electrodes 5, and a resist layer 6. The wiring board 2 has a main body portion 21 and a side wall portion 22.

The main body portion 21 is formed in a rectangular plate shape and has a first surface 23 and a second surface 24 on a side opposite to the first surface 23. The first surface 23 and the second surface 24 are, for example, flat surfaces parallel to each other. The second surface 24 is rectangular and has four edges 24a, 24b, 24c, and 24d. The edges 24a and 24b are opposite each other and form short sides of the second surface 24. The edges 24c and 24d are opposite each other and form long sides of the second surface 24. Hereinafter, a direction parallel to the edges 24a and 24b will be described as a Y direction, and a direction parallel to the edges 24c and 24d will be described as an X direction.

The side wall portion 22 is disposed on the first surface 23 along edges of the first surface 23 and has a rectangular frame shape when viewed in a thickness direction D of the wiring board 2 (a direction perpendicular to the first surface 23 and the second surface 24). The wiring board 2 is formed, for example, by stacking a main body portion 21 and a side wall portion 22 both of which are made of a glass epoxy resin.

A ventilation hole 25 that penetrates the first surface 23 and the second surface 24 along the thickness direction D is formed in the main body portion 21. The ventilation hole 25 is, for example, an air hole having a circular cross section and opens to the first surface 23 and the second surface 24. The ventilation hole 25 is formed at a position closer to the edge 24b than to the edge 24a and closer to the edge 24d than to the edge 24c when viewed in the thickness direction D. When distances between the ventilation hole 25 and each of the edges 24a, 24b, 24c, and 24d are distances L1, L2, L3, and L4, respectively, the distances L1 to L4 have a relationship of L1>L3>L4>L2. Among the edges 24a to 24d, the edge 24a is the furthest from the ventilation hole 25, and the edge 24b is the closest to the ventilation hole 25. The distance L3 may be shorter than the distance L4 or equal to the distance L4.

The cover 3 is a lid member disposed to face the first surface 23 and defines an accommodation space (a cavity) S between the first surface 23 and the cover 3. The cover 3 is formed in a rectangular plate shape by a light-transmitting material such as glass, for example. The cover 3 is disposed on a top surface 22b of the side wall portion 22 to close an opening 22a of the side wall portion 22 and is fixed to the top surface 22b with an adhesive 31. As a result, the part between the cover 3 and the top surface 22b are hermetically sealed. The accommodation space S is defined by the main body portion 21, the side wall portion 22, and the cover 3. The accommodation space S communicates with the outside of the optical semiconductor device 1 through the ventilation hole 25.

The optical semiconductor element 4a and the reading element 4b are disposed on the first surface 23 and are located in the accommodation space S. The optical semiconductor element 4a is, for example, a light receiving element (a light detecting element) such as an avalanche photodiode (APD) and is a semiconductor chip in which a light receiving portion is built in a semiconductor substrate. The reading element 4b is an element forming a reading circuit for reading a signal from the optical semiconductor element 4a. The optical semiconductor element 4a and the reading element 4b are fixed on the first surface 23 with a die bond resin 32. The optical semiconductor element 4a and the reading element 4b are disposed apart from each other to face in the Y direction.

A plurality of electrode pads 41 are provided on an upper surface of each of the optical semiconductor element 4a and the reading element 4b. Each of these electrode pads 41 is electrically connected to one of a plurality of electrode pads 11 disposed on the first surface 23 via a wire 12. The plurality of electrode pads 11 include electrode pads 11*a* disposed side by side around the reading element 4*b* and electrode pads 11*b* disposed side by side between the optical semiconductor element 4*a* and the reading element 4*b*. The electrode pad 11*a* is electrically connected to the electrode 5, which will be described later, via a wiring 13 disposed on the first surface 23. The electrode pad 11*b* is electrically connected to each of the electrode pads 41 of the optical semiconductor element 4*a* and the reading element 4*b* via a wire 12. The optical semiconductor element 4*a* and the reading element 4*b* are electrically connected to each other via the electrode pad 11*b* and the wire 12.

A wiring 14 is led out from a bottom surface of each of the optical semiconductor element 4*a* and the reading element 4*b*. The wiring 14 is electrically connected to each of the optical semiconductor element 4*a* and the reading element 4*b* on the bottom surface and extends from each of the optical semiconductor element 4*a* and the reading element 4*b* toward the edge of the second surface 24. The wiring 14 is electrically connected to the electrode 5 which will be described later.

Figure 3:
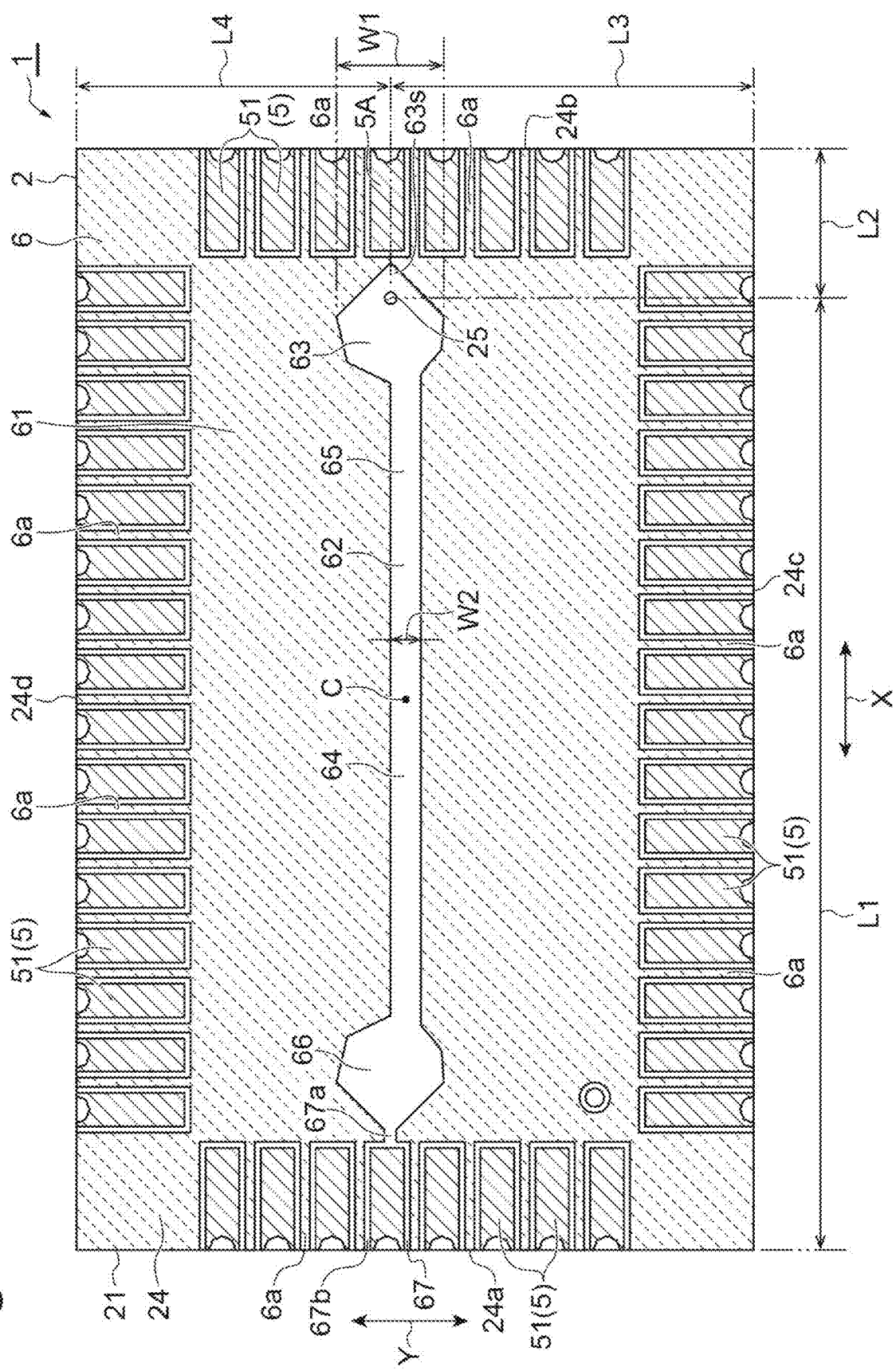
FIG. 3 is a bottom view of the optical semiconductor device.
Figure 4:
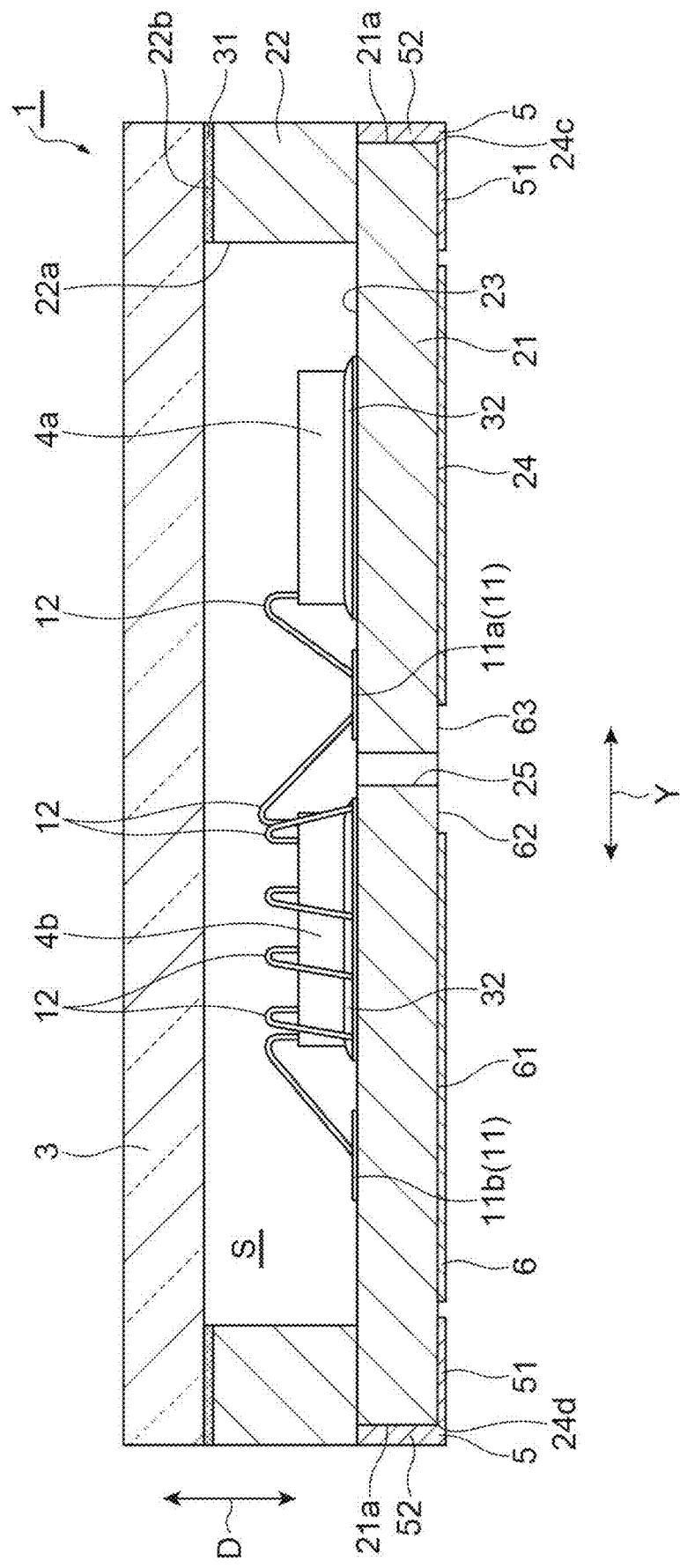
FIG. 4 is a cross-sectional view along line IV-IV of FIG. 1.

Each of a plurality of electrodes 5 is a metal layer (a metallized layer) formed on the surface of the wiring board 2, and the plurality of electrodes 5 are provided for electrical connection between the optical semiconductor element 4*a* and the outside and between the reading element 4*b* and the outside. In FIGS. 2A, 2B, and 3, a region where the electrode 5 is disposed is shown by hatching. Each electrode 5 has a first portion 51 and a second portion 52. The first portion 51 is formed in a substantially rectangular shape and is disposed on the second surface 24. The first portions 51 are arranged at equal intervals along each of the edges 24*a* to 24*d* of the second surface 24. The second portion 52 is formed in a substantially rectangular shape and is disposed on a side surface 21*a* of the main body portion 21 of the wiring board 2 to extend from the first portion 51 in the thickness direction D. The wiring 13 or the wiring 14 described above is electrically connected to the second portion 52. That is, the plurality of electrodes 5 include electrodes 5 that is electrically connected to the optical semiconductor element 4*a* and the reading element 4*b* via the wiring 13 or the wiring 14. The plurality of electrodes 5 may include an electrode 5 that is not electrically connected to the optical semiconductor element 4*a* and the reading element 4*b*.

The resist layer 6 is disposed on the second surface 24. In FIG. 3, a region where the resist layer 6 is disposed is shown by hatching with a broken line. The resist layer 6 is formed in a layer shape by an insulating material having low wettability against solder. The resist layer 6 is located between at least the plurality of electrodes 5 in order to ensure an insulating property between the electrodes 5. That is, the resist layer 6 has a portion 6*a* disposed in a region between adjacent electrodes 5.

The second surface 24 of the wiring board 2 has a disposition region 61 in which the resist layer 6 is disposed and a non-disposition region 62 in which the resist layer 6 is not disposed. That is, in general, the resist layer 6 is disposed over the entire surface of the second surface 24, but in the optical semiconductor device 1, a non-disposition region 62 in which the resist layer 6 is not disposed is provided. As described above, the disposition region 61 includes the region between the adjacent electrodes 5.

The non-disposition region 62 includes a first region 63 and a second region 64. The ventilation hole 25 is disposed in the first region 63. The first region 63 is formed in a polygonal shape having a plurality of corners (a substantially hexagonal shape in this example). The plurality of corners include a corner 63*s* protruding toward an electrode 5A. The electrode 5A is an electrode disposed at a position closest to the ventilation hole 25 among the plurality of electrodes 5. The first portion 51 of the electrode 5A is disposed between the ventilation hole 25 and the edge 24*b*. The corner 63*s* is disposed corresponding to the electrode 5A and faces the electrode 5A in the X direction. The ventilation hole 25 is disposed inside the first region 63 and is separated from all edges of the first region 63. A distance between the ventilation hole 25 and the electrode 5A is shorter than a distance between the ventilation hole 25 and a center C of the second surface 24.

The second region 64 extends to reach the edge 24*a* of the second surface 24 from the first region 63. That is, the second region 64 reaches the edge 24*a* farthest from the ventilation hole 25 among the edges 24*a* to 24*d* of the second surface 24. The second region 64 includes a first extending portion 65 connected to the first region 63, a widened portion 66 connected to the first extending portion 65, and a second extending portion 67 that extends to reach the edge 24*a* from the widened portion 66.

The first extending portion 65 extends linearly from the first region 63 in the X direction. The widened portion 66 is disposed at a position symmetrical to the first region 63 with respect to a straight line passing through the center C of the second surface 24 and parallel to the Y direction and has a shape symmetrical to that of the first region 63 with respect to the straight line. The second extending portion 67 includes a first portion 67*a* and a second portion 67*b*. The first portion 67*a* extends linearly along the X direction between the widened portion 66 and the second portion 67*b*. The second portion 67*b* is a rectangular region slightly larger than the electrode 5, and one electrode 5 (the first portion 51) is disposed in the second portion 67*b*. The second portion 67*b* reaches the edge 24*a*. Similarly, each of other electrodes 5 is disposed in the rectangular region where the resist layer 6 is not disposed.

A portion of the non-disposition region 62 excluding the second extending portion 67 has a shape symmetrical with respect to a straight line passing through the center C of the second surface 24 and parallel to the Y direction. A width W2 of the first extending portion 65 is narrower than a width W1 of the first region 63. The width W2 of the first extending portion 65 is a length (a maximum length) of the first extending portion 65 in a direction perpendicular to an extending direction (the X direction in this example) of the first extending portion 65. The width W1 of the first region 63 is a length (a maximum length) of the first region 63 in the direction perpendicular to the extending direction of the first extending portion 65. A width of the second extending portion 67 (a width of each of the first portion 67*a* and the second portion 67*b*) is narrower than the width W1 of the first region 63. As described above, in this example, a width of the widened portion 66 is equal to the width W1 of the first region 63 and wider than the width W2 of the first extending portion 65. The width of the widened portion 66 is a length (a maximum length) of the widened portion 66 in the direction perpendicular to the extending direction of the first extending portion 65.

An area of the non-disposition region 62 is 40% or less of an area of the second surface 24. The "area of the non-disposition region 62" is an area of a region consisting of the first region 63 and the second region 64 and does not include an area of a region where the electrode 5 is disposed and the resist layer 6 is not disposed. The area of the region where the plurality of electrodes 5 are disposed in the second surface 24 is 15% or more of the area of the second surface 24.

The non-disposition region 62 is disposed at a position where it does not overlap the electrode pad 11 in the thickness direction D. In other words, the electrode pad 11 is disposed at a position where it does not overlap the non-disposition region 62 in the thickness direction D. That is, when viewed in the thickness direction D, the non-disposition region 62 does not overlap the electrode pad 11. In FIG. 1, a region of the first surface 23 corresponding to the non-disposition region 62 is shown by a broken line.

The optical semiconductor device 1 is mounted on a mounting board such as a printed circuit board, for example. Specifically, by soldering the plurality of electrodes 5 to electrodes of the mounting board through, for example, reflow, the optical semiconductor device 1 is electrically connected to the mounting board. For this soldering, solder containing a flux for removing an oxide film is used. Alternatively, soldering is performed while a flux is supplied. In a state where the optical semiconductor device 1 is mounted on the mounting board, the accommodation space S communicates with the outside through the ventilation hole 25 and the non-disposition region 62, and air can flow between the accommodation space S and the outside.

[Function and Effect]

In the optical semiconductor device 1, the ventilation hole 25 is formed in the wiring board 2. Thus, it is possible to prevent foreign matter from entering through the ventilation hole 25, for example, at the time of cutting the wiring board 2 or the like, and it is possible to ensure reliability. Further, the ventilation hole 25 can be easily formed as compared with a case where the ventilation hole 25 is formed in the cover 3. Further, the second surface 24 of the wiring board 2 has the disposition region 61 in which the resist layer 6 is disposed and the non-disposition region 62 in which the resist layer 6 is not disposed, and the non-disposition region 62 includes the first region 63 in which the ventilation hole 25 is disposed and the second region 64 that reaches the edge 24a of the second surface 24 from the first region 63. Since the flux is less likely to flow into the non-disposition region 62, by disposing the ventilation hole 25 in the first region 63, it is possible to prevent the flux from entering the ventilation hole 25. Further, since the second region 64 that reaches the edge 24a of the second surface 24 from the first region 63 is provided, air easily flows into the second region 64 from the outside, and as a result, the flowing air can prevent the flux from entering the ventilation hole 25. It is possible to sufficiently ensure the amount of air sucked from the ventilation hole 25 during cooling after reflow for mounting the optical semiconductor device 1 on the mounting board. Further, a second region 64 that reaches the edge 24a of the second surface 24 from the first region 63 is provided, and the accommodation space S is connected to the outside via the ventilation hole 25 and the non-disposition region 62, and thus even in a state where the optical semiconductor device 1 is mounted on a mounting target, it is possible to improve reliability against expansion and contraction due to heat and dew condensation. Therefore, according to the optical semiconductor device 1, it is possible to ensure reliability and prevent the flux from entering the ventilation hole 25. That is, when the flux enters the accommodation space S through the ventilation hole 25, separation of the cover 3, internal dew condensation, corrosion of a terminal or an electrode pad, sensitivity deterioration due to the flux becoming foreign matter, and the like may occur, but according to the optical semiconductor device 1, it is possible to suppress the occurrence of them.

The second region 64 reaches the edge 24a which is an edge other than the edge 24b closest to the ventilation hole 25 among the plurality of edges 24a to 24d of the second surface 24. As a result, it is possible to effectively prevent the flux from entering the ventilation hole 25. That is, since the second region 64 reaches the edge other than the edge 24b, it is possible to ensure the distance between the ventilation hole 25 and the edge, and it is possible to prevent the flux from entering the ventilation hole 25 from a side of the edge. Further, by disposing the resist layer 6 between the ventilation hole 25 and the edge 24b closest to the ventilation hole 25, it is possible to effectively prevent the flux from entering the ventilation hole 25.

The plurality of electrodes 5 include the electrodes 5 disposed side by side along the edge 24b closest to the ventilation hole 25. In a case where the electrodes 5 are disposed along the edge 24b, the flux easily enters the ventilation hole 25 from a side of the edge 24b, but according to the optical semiconductor device 1, even in such a case, it is possible to prevent the flux from entering the ventilation hole 25.

The second region 64 reaches the edge 24a farthest from the ventilation hole 25 among the plurality of edges 24a to 24d of the second surface 24. As a result, it is possible to effectively prevent the flux from entering the ventilation hole 25.

In other words, the electrode pad 11 disposed on the first surface 23 is disposed at a position where it does not overlap the non-disposition region 62 in the thickness direction D of the wiring board 2. As a result, the resist layer 6 is disposed at a position corresponding to the electrode pad 11 on the second surface 24, and thus a wire, a bump, or the like can be satisfactorily connected to the electrode pad 11. That is, when a wire, a bump, or the like is connected to the electrode pad 11, it is preferable that the resist layer 6 be disposed at a position corresponding to the electrode pad 11 on the second surface 24 in order to receive a force acting at the time of connection. Further, the disposition of the resist layer 6 at a position corresponding to the electrode pad 11 on the second surface 24 is also preferable from the viewpoint of facilitating transmission of ultrasonic waves during wire bonding.

The area of the non-disposition region 62 is 40% or less of the area of the second surface 24. As a result, it is possible to ensure the area of the disposition region 61 as a region into which the flux flows (a flux escape region), and it is possible to effectively prevent the flux from entering the ventilation hole 25.

The second region 64 includes the first extending portion 65 having the width W2 narrower than the width W1 of the first region 63. As a result, the area of the disposition region 61 can be ensured in the position far from the ventilation hole 25 while the width of the non-disposition region 62 can be ensured in the first region 63 close to the ventilation hole 25, and it is possible to effectively prevent the flux from entering the ventilation hole 25.

The area of the region where the plurality of electrodes 5 are disposed on the second surface 24 is 15% or more of the area of the second surface 24. In a case where the area of the region where the plurality of electrodes 5 are disposed on the second surface 24 is large, a situation where the flux enters the ventilation hole 25 easily occurs, but according to the optical semiconductor device 1, even in such a case, it is possible to prevent the flux from entering the ventilation hole 25.

The first region 63 is formed in a polygonal shape having a plurality of corners. As a result, it possible to effectively prevent the flux from entering the ventilation hole 25 as compared with a case where the first region 63 is formed in a circular shape, for example.

The plurality of corners of the first region 63 include the corner 63s protruding toward the electrode 5A disposed at a position closest to the ventilation hole 25 among the plurality of electrodes 5. As a result, the flux that has reached the corner 63s from a side of the electrode 5A easily flows to both sides of the corner 63s, and thus it is possible to effectively prevent the flux from entering the ventilation hole 25.

The second region 64 includes the first extending portion 65 that extends from the first region 63 and the widened portion 66 that has a width wider than the width W2 of the first extending portion 65. As a result, even in a case where the flux enters the second region 64 from a side of the widened portion 66, it is possible to suppress a situation where the second region 64 is blocked with the flux. In particular, in a case where the electrodes 5 are disposed in the second portion 67b of the second extending portion 67 as in the above embodiment, the flux easily flows into the second region 64 from a side of the electrodes 5 at the time of mounting.

The widened portion 66 is disposed at a position symmetrical to the first region 63 with respect to the straight line passing through the center C of the second surface 24. As a result, it is possible to make the flow of the flux symmetrical at the time of mounting, and it is possible to suppress the occurrence of positional deviation at the time of mounting.

The widened portion 66 has a shape symmetrical to the first region 63 with respect to the straight line passing through the center C of the second surface 24. As a result, it is possible to further suppress the occurrence of positional deviation at the time of mounting.

The distance between the ventilation hole 25 and the electrode 5A disposed at a position closest to the ventilation hole 25 among the plurality of electrodes 5 is shorter than the distance between the ventilation hole 25 and the center C of the second surface 24. In a case where the distance between the ventilation hole 25 and the electrode 5A is short, a situation where the flux enters the ventilation hole 25 easily occurs, but according to the optical semiconductor device 1, even in such a case, it is possible to prevent the flux from entering the ventilation hole 25.

MODIFICATION EXAMPLE

Figure 5A:
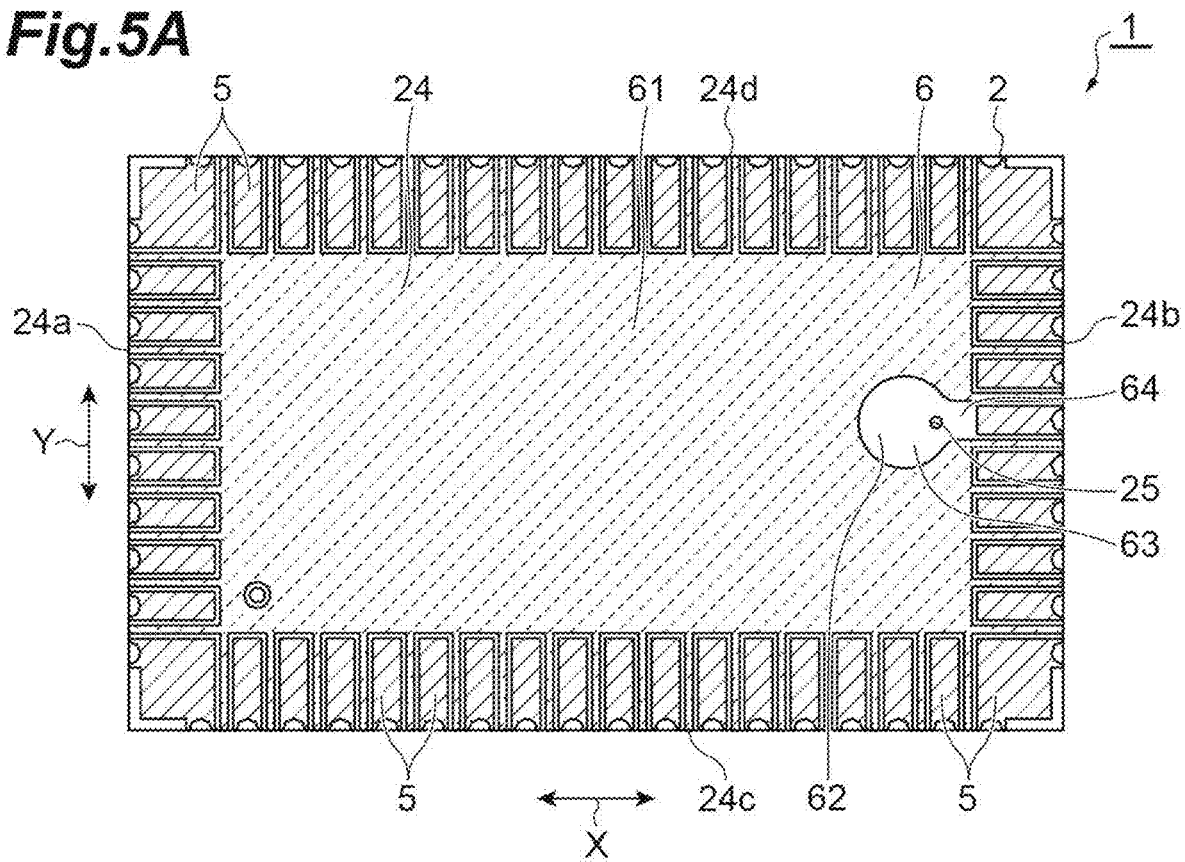
FIG. 5A is a bottom view of an optical semiconductor device according to a first modification example.
Figure 5B:
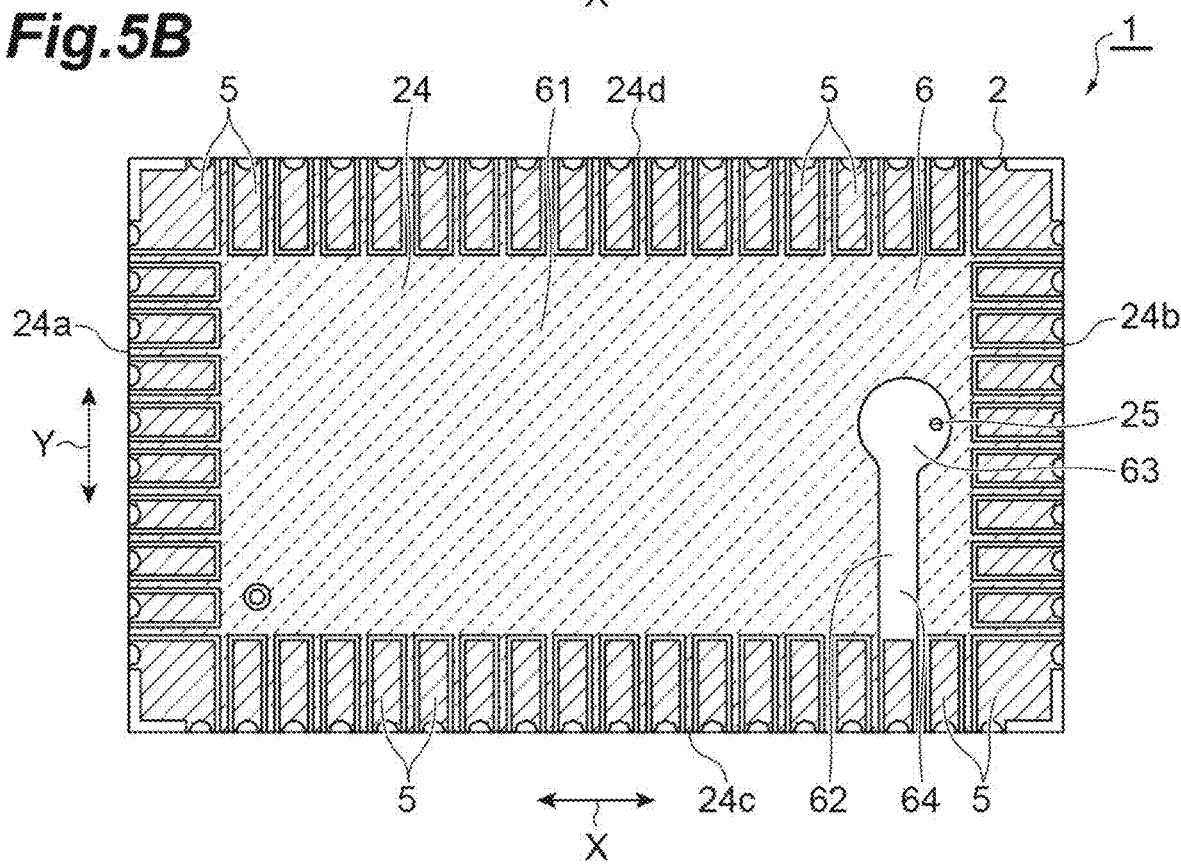
FIG. 5B is a bottom view of an optical semiconductor device according to a second modification example.

The second region 64 may reach at least one of the edges 24a to 24d of the second surface 24. For example, as in a first modification example shown in FIG. 5A, the second region 64 may reach the edge 24b closest to the ventilation hole 25 among the edges 24a to 24d. Alternatively, as in a second modification example shown in FIG. 5B, the second region 64 may reach the edge 24c. In the first modification example and the second modification example, the first region 63 is formed in a circular shape. The electrodes 5 are also disposed in the four corners of the second surface 24.

Figure 6:
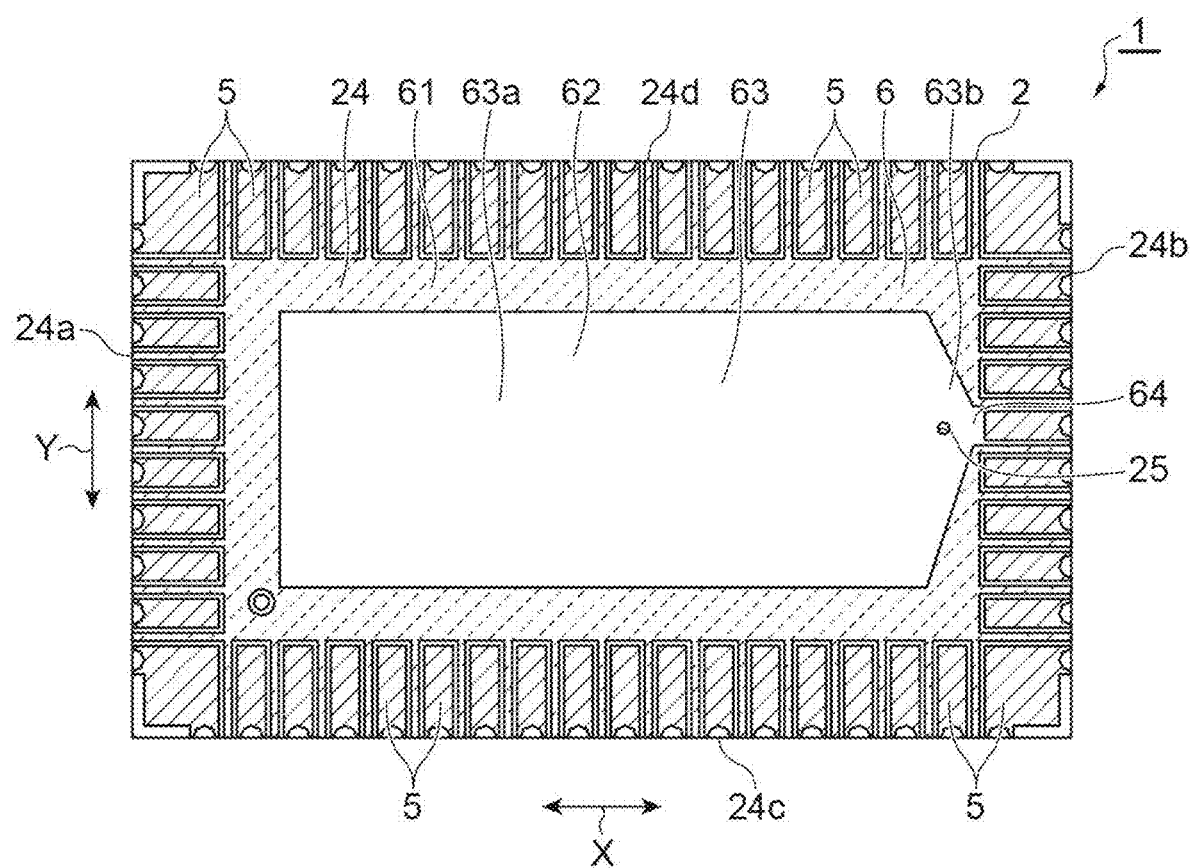
FIG. 6 is a bottom view of an optical semiconductor device according to a third modification example.

The non-disposition region 62 may be configured as in a third modification example shown in FIG. 6. In the third modification example, the second region 64 reaches the edge 24b of the second surface 24. The first region 63 has a region 63a of a rectangular shape and a region 63b connected to the region 63a on the edge 24b side and whose width becomes narrower toward the edge 24b. The ventilation hole 25 is disposed in the region 63b.

The present disclosure is not limited to the above embodiments. For example, as a material and a shape of each constituent element, not only the above-mentioned material and shape but also various materials and shapes can be employed. In the above embodiments, the optical semiconductor element 4a may be a light emitting element, and in this case, the element 4b may be a driving element forming a driving circuit for driving the optical semiconductor element 4a. Both of the elements 4a and 4b may be optical semiconductor elements (light receiving elements, light emitting elements, and the like). Alternatively, the element 4b may be omitted and only the optical semiconductor element 4a may be provided.

In the above embodiment, the width W1 of the first region 63 may be equal to the width W2 of the first extending portion 65. Even in this case, the region where the ventilation hole 25 is disposed can be regarded as the first region 63, and the portion extending from the first region 63 can be regarded as the first extending portion 65. In the above embodiment, the widened portion 66 may not be provided, and for example, the first extending portion 65 may extend to reach the edge 24a. The shape of the first region 63 may be any shape such as a polygonal shape other than a hexagonal shape or a circular shape. The electrodes 5 may not be disposed on the second portion 67b of the second extending portion 67. That is, the electrodes 5 may not be disposed in the second region 64. The widened portion 66 may not have a shape symmetrical to the first region 63 with respect to the straight line passing through the center C of the second surface 24 or may be formed in any shape.

What is claimed is:
1. An optical semiconductor device comprising:
a wiring board including a first surface and a second surface on a side opposite to the first surface;
a cover disposed to face the first surface and defining an accommodation space between the first surface and the cover;
an optical semiconductor element disposed on the first surface and located in the accommodation space;
a plurality of electrodes disposed on the second surface; and
a resist layer disposed on the second surface and located at least between the plurality of electrodes,
wherein a ventilation hole that penetrates the first surface and the second surface is formed in the wiring board,
wherein the second surface includes a disposition region in which the resist layer is disposed and a non-disposition region in which the resist layer is not disposed, and
wherein the non-disposition region includes a first region in which the ventilation hole is disposed and a second region that reaches an edge of the second surface from the first region.
2. The optical semiconductor device according to claim 1, wherein the second surface includes a plurality of edges, and
wherein the second region reaches an edge other than an edge closest to the ventilation hole among the plurality of edges.
3. The optical semiconductor device according to claim 2, wherein the plurality of electrodes include an electrode disposed along the edge closest to the ventilation hole.
4. The optical semiconductor device according to claim 1, wherein the second surface has a plurality of edges, and
wherein the second region reaches an edge farthest from the ventilation hole among the plurality of edges.

5. The optical semiconductor device according to claim 1, further comprising:
an electrode pad disposed on the first surface and electrically connected to the optical semiconductor device,
wherein the electrode pad is disposed at a position where the electrode pad does not overlap the non-disposition region in a thickness direction of the wiring board.

6. The optical semiconductor device according to claim 1, wherein an area of the non-disposition region is 40% or less of an area of the second surface.

7. The optical semiconductor device according to claim 1, wherein the second region includes a portion having a width narrower than a width of the first region.

8. The optical semiconductor device according to claim 1, wherein an area of a region where the plurality of electrodes are disposed in the second surface is 15% or more of an area of the second surface.

9. The optical semiconductor device according to claim 1, wherein the first region is formed in a polygonal shape having a plurality of corners.

10. The optical semiconductor device according to claim 9, wherein the plurality of corners include a corner protruding toward an electrode disposed at a position closest to the ventilation hole among the plurality of electrodes.

11. The optical semiconductor device according to claim 1, wherein the second region includes an extending portion that extends from the first region and a widened portion having a width wider than a width of the extending portion.

12. The optical semiconductor device according to claim 11, wherein the widened portion is disposed at a position symmetrical to the first region with respect to a straight line passing through a center of the second surface.

13. The optical semiconductor device according to claim 11, wherein the widened portion has a shape symmetrical to that of the first region with respect to a straight line passing through a center of the second surface.

14. The optical semiconductor device according to claim 1, wherein a distance between the ventilation hole and an electrode disposed at a position closest to the ventilation hole among the plurality of electrodes is shorter than a distance between the ventilation hole and a center of the second surface.

* * * * *